United States Patent
Gardner et al.

[11] Patent Number: 5,851,921
[45] Date of Patent: Dec. 22, 1998

[54] SEMICONDUCTOR DEVICE AND METHOD FOR FORMING THE DEVICE USING A DUAL LAYER, SELF-ALIGNED SILICIDE TO ENHANCE CONTACT PERFORMANCE

[75] Inventors: Mark I. Gardner, Cedar Creek; Fred N. Hause, Austin, both of Tex.

[73] Assignee: Advanced Micro Devices, Inc.

[21] Appl. No.: 832,747

[22] Filed: Apr. 4, 1997

[51] Int. Cl.⁶ ................................................... H01L 21/44
[52] U.S. Cl. ............................................. 438/655; 438/664
[58] Field of Search .................................... 438/586, 655, 438/664

[56] References Cited

U.S. PATENT DOCUMENTS

| | | | |
|---|---|---|---|
| 5,047,367 | 9/1991 | Wei et al. | 437/200 |
| 5,103,272 | 4/1992 | Nishiyama | 357/23.4 |
| 5,529,958 | 6/1996 | Yaoita | 437/200 |
| 5,567,652 | 10/1996 | Nishio | 437/200 |
| 5,691,212 | 11/1997 | Tsai et al. | 437/24 |

*Primary Examiner*—Brian Dutton
*Attorney, Agent, or Firm*—Kevin L. Daffer; Conley, Rose & Tayon

[57] ABSTRACT

An integrated circuit is formed by a process which can produce highly conductive contact structures. The contact structures result from a dual layer of titanium and cobalt reacted upon silicon-rich source/drain junctions and gate conductor upper surfaces. Reaction on the silicon-rich regions occur concurrent with one another using a self-aligned salicidation process, whereby the titanium layer can consume relatively large amounts of native oxide formed on the silicon-rich regions. In addition to interdiffusion of titanium, cobalt placed upon the titanium enhances the overall conductivity of the contact while providing some barrier properties against undue, additional interdiffusion of titanium and underlying silicon.

20 Claims, 4 Drawing Sheets

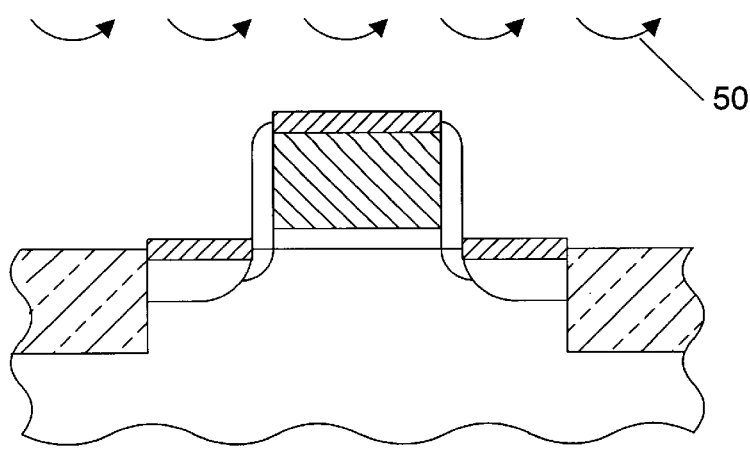
FIG. 7B
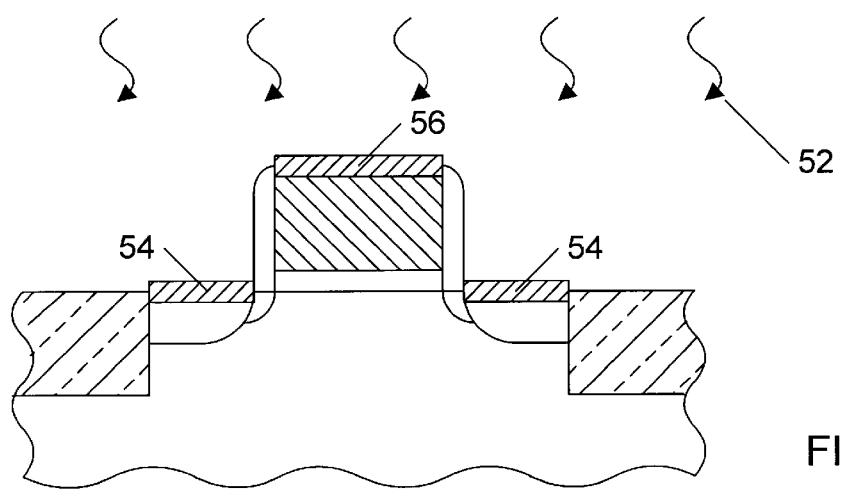
FIG. 8
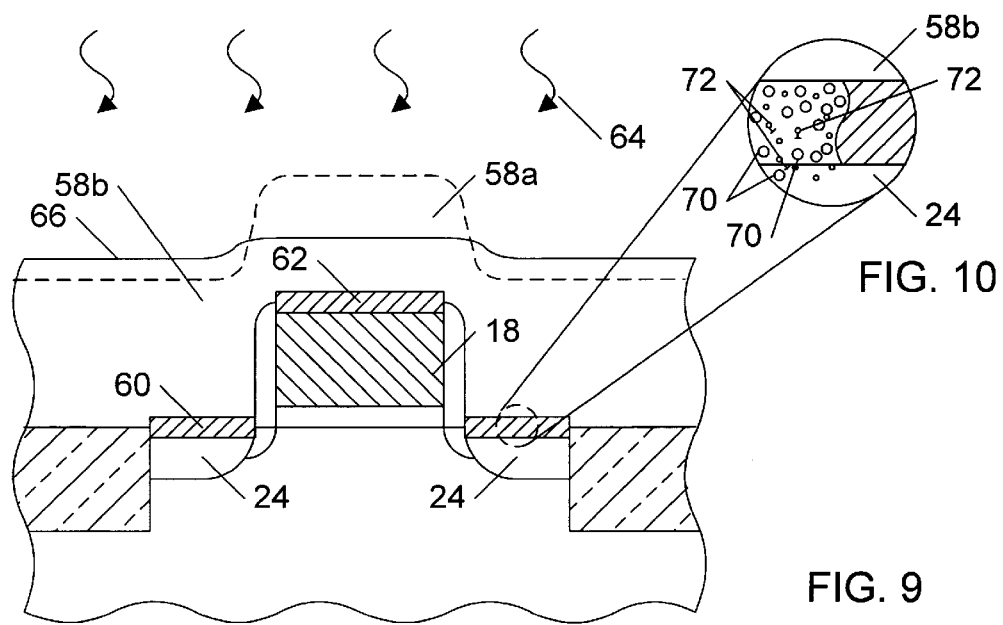
FIG. 9
FIG. 10

SEMICONDUCTOR DEVICE AND METHOD FOR FORMING THE DEVICE USING A DUAL LAYER, SELF-ALIGNED SILICIDE TO ENHANCE CONTACT PERFORMANCE

BACKGROUND OF THE INVENTION

1. Field of the Invention

This invention relates to integrated circuit fabrication and more particularly to an improved self-aligned silicide ("salicide") technique using dual metal layers and the advancements provided by the ordering of those layers.

2. Description of the Relevant Art

Fabrication of an integrated circuit involves numerous processing steps. After impurity regions have been deposited within a semiconductor substrate and gate areas defined upon the substrate, interconnect routing is placed on the semiconductor topography and connected to contact areas thereon to form an integrated circuit. The entire process of making an ohmic contact to the contact areas and routing interconnect material between ohmic contacts is described generally as "metalization". While, materials other than metals are often, the term metalization is generic in its application. As the complexity of integrated circuits has increased, the complexity of the metalization composition has also increased.

The impurity regions deposited within a semiconductor substrate are often referred to as junctions. A junction is generally configured near a gate conductor within a substrate, of either similar or dissimilar dopant type than the substrate itself. Earlier contact structures involved depositing an interlevel dielectric over the junctions and gate conductors, and then etching an opening or window through the interlevel dielectric directly above the junctions to which contact is to be made. Etching the opening for the window involved numerous problems. For example, the contact window opening required an additional masking step. Unfortunately, the mask is often times misaligned with the junction, resulting in increased junction capacitance. Additionally, opening a window of minimum size through a relatively thick interlevel dielectric is, by its nature, problematic. In order to achieve a relatively anisotropic etch, a plasma etch is required, leaving deleterious amounts of etch byproducts (e.g., polymers) at the base of the opening. Still further, difficulties arise whenever the interconnect material must extend over the interlevel dielectric and into the relatively small opening through the interlevel dielectric. Most conventional interconnect materials, such as aluminum, were unable to fill the openings without "cusping", or without encountering step coverage at the juncture between the window and the interlevel dielectric surface.

More modern contact structures make use of contacts which are self-aligned with the junctions. More specifically, those contacts are referred to as self-aligned silicides, or salicides. A salicide process involves depositing a metal across the semiconductor topography, and then reacting the metal only in regions where silicon atoms are present. Resulting from the reaction step, silicides form only at the upper surfaces of the junctions and the upper surfaces of the polysilicon gate conductors. A region between the junctions and the gate conductor upper surfaces is pre-disposed with a sidewall spacer generally formed from silicon dioxide (oxide).

It is not until after the silicides are self-aligned to the silicon-bearing underlayers is an interlevel dielectric formed. The interlevel dielectric undergoes a patterned etch over the regions to which contact must be made. However, the pattern etch placement is not deemed as crucial as the etch needed to form a contact window in pre-salicide processes. More specifically, the etch to the underlying salicide need only contact a portion of the salicide and need not be carefully bounded to the entire perimeter of the salicide. Another advantage to using a salicide, beyond its self-aligned properties, is the retained purity of the silicon-based material prior to silicide growth. Silicide is grown upon and into the junctions without necessarily having to pre-clean those surfaces of interlevel dielectric etch byproducts commonly encountered in pre-salicide techniques. While etch byproducts do not arise, native oxides nonetheless grow on the silicon-based surfaces prior to silicide formation. That growth is often referred to as "native oxide". Native oxide is a natural result of removing the silicon topography from a chamber and placing it into another chamber used in depositing a silicide-forming metal.

There are many types of metals used to form silicides. The most popular metal types include the Group VIII metals or titanium (Ti). The Group VIII metals include cobalt (Co), platinum (Pt), palladium (Pd), and nickel (Ni). The Group VIII metals typically react with underlying silicon at relatively low temperatures, e.g., at 600° C. or less. The Group VIII metals exhibit fairly low resistivity, however, they cannot reduce substantially thick native oxides formed on the silicon-based surface. More specifically, Group VIII metal atoms and silicon atoms cannot interdiffuse across a native oxide having a thickness exceeding, for example, 50 angstroms. Resulting from the shortcomings of Group VIII metals, titanium has been used for its ability to reduce native oxide layers exceeding 50 angstroms. Titanium is the only know refractory metal that can reliably form silicide on both polysilicon and silicon surfaces having naturally occurring native oxides.

The benefits of titanium readily diffusing into underlying silicon is also a detriment, to some extent. Elaborate procedures have been established to prevent too much interdiffusion not only in the underlying silicon surface, but also into adjacent oxide surfaces. Typically, formation of a titanium salicide involves a two-step anneal process. The first anneal step forms a first phase material at a relatively low temperature. The first phase material exists only on and within the silicon-based surfaces. The first anneal temperature is relatively low so as to prevent substantial interdiffusion within adjoining oxide surfaces. The second anneal step occurs at a relatively high temperature, provided the unreacted titanium is removed in the interim.

Even though titanium diffusion is carefully controlled using, for example, the two-step anneal sequence, problems still exist. For example, the affinity of titanium and silicon interdiffusion is so extensive that in some instances titanium can "spike" through relatively shallow junctions. Elaborate techniques must be used to minimize the occurrence of spiking by incorporating, for example, nitrogen within the titanium to self-limit silicide formation. The nitrogen forms a multilayer diffusion barrier comprising $TiN/Ti/TiSi_2$.

It would be desirable to utilize the benefits of a multilayered barrier structure, while minimizing the unruly effects of titanium silicide growth. It would be furher beneficial to minimize titanium interdiffusion with silicon using a composition which can enhance contact conductivity. The improved contact structure may possibly be formed without requiring a nitradation of the titanium upper surface as a self-limiting step in barrier formation. The nitradation barrier layer may conceivably be displaced, or added to, by a conductive material which can serve as a diffusion barrier but enhance the overall conductivity of a relatively small ULSI contact.

SUMMARY OF THE INVENTION

The problems outlined above are in large part solved by a fabrication process of the present invention. That is, a process is provided whereby a dual layer barrier structure is formed. The dual layers of titanium, followed by cobalt, produce a contact structure with all the benefits of titanium as well as cobalt. Thus, instead of using titanium in lieu of cobalt, or cobalt in lieu of titanium, the present structure uses both, placed in series according to a salicide processing sequence.

According to one embodiment, both the titanium and cobalt layers are deposited in succession using, for example, a chemical vapor deposition (CVD) technique. The layers of titanium and cobalt are reacted with the underlying silicide-base surfaces (using minimal anneal cycles). Resulting from possibly a single anneal, both cobalt and titanium interdiffuse into the silicon-based surfaces comprising junction and gate conductor upper surfaces. The unreacted cobalt and titanium layers are thereafter removed, leaving self-aligned silicides on which an interlevel dielectric can thereafter be placed.

According to an alternative embodiment, the titanium layer can be exposed to nitrogen during its deposition. The nitrogen extends into the upper surface of the titanium on which the cobalt layer is placed. Thereafter, cobalt extends partially into the titanium, and nitrogen extends further into the titanium during anneal, subsequent to both deposition processes. In this embodiment, nitrogen serves substantially as the barrier, with cobalt also providing some barrier properties against undue interdiffusion of titanium silicide. In the instance where nitrogen is not placed, then cobalt serves primarily as the barrier. The benefit of using cobalt as the barrier is for the purpose of its high conductivity relative to a TiN layer.

According to yet another embodiment, the titanium layer undergoes anneal prior to depositing a cobalt layer. Anneal of the titanium occurs at a relatively low temperature either in the presence of nitrogen or in the absence of nitrogen. The unreacted titanium can either be left or removed from the substrate topography. Preferably, the unreacted titanium is removed, leaving titanium only on the silicon-based surfaces. Thereafter, a layer of cobalt is deposited on the titanium, and a second, higher temperature anneal is performed. The second anneal step further reacts titanium with silicide to form a stochiometric $TiSi_2$ material at the interface. Cobalt, or nitrogen, provide a barrier against undue interdiffusion and spiking of relatively shallow junctions.

It is postulated that cobalt readily interdiffuses along the grain boundaries of the titanium when exposed to temperature. Cobalt atoms, being larger than titanium, extend along the grain boundary avenues near the lower surface of the titanium. Stuffing the grain boundaries by cobalt helps prevent additional titanium atoms from interdiffusing into the underlying silicon, or vice versa. As such, it is contemplated that cobalt serve as a barrier, similar to the way in which nitrogen has conventionally been employed. It is further contemplated that, as a result of cobalt barrier properties, possibly a single anneal cycle can be used. The single anneal is chosen at a temperature to cause interdiffusion only on silicon-rich surfaces. The stuffed grain boundaries along the titanium/oxide surface substantially prevents silicide growth thereon. However, a prevalent amount of silicon atoms on silicon-based surfaces allows salicidation even though cobalt is present. After the single anneal cycle, a single etch is used to remove unreacted titanium and cobalt layers. An overetch may be needed to remove the possible small amounts of silicide formed on the oxide surfaces. However, the overetch will not be sufficient to remove relatively large amounts of silicide formed on silicon surfaces.

The silicon-based surfaces comprise source and drain regions, along with an upper surface of a gate conductor. Accordingly, the method assumes a pre-existing sidewall spacer formed on opposing surfaces of the gate conductor. The source and drain regions, as well as a gate conductor upper surface, are receptive to a layer of titanium. A layer of cobalt can then be deposited on the titanium either directly or after the titanium undergoes an anneal. Subsequent to depositing the layer of cobalt, the dual layers of titanium and cobalt can undergo an anneal (i.e., either a the first anneal of only one anneal or the first anneal of a two-step anneal). If two anneal cycles are used, then the unreacted layers of cobalt and titanium are removed prior to heating the silicon surfaces and the layers of cobalt and titanium are annealed at a second temperature greater than the first temperature used in reacting the layers of cobalt and titanium. The second temperature produces titanium or cobalt disilicide, whereas the first temperature forms $XSi_y$, where X consist of titanium or cobalt and where Y is less than 2.

BRIEF DESCRIPTION OF THE DRAWINGS

Other objects and advantages of the invention will become apparent upon reading the following detailed description and upon reference to the accompanying drawings in which:

FIG. 5a is a cross-sectional view of the semiconductor topography, wherein the layers of titanium and cobalt are annealed to produce a self-aligned silicide upon only the gate conductor and the source/drain regions, in a processing step subsequent to FIG. 4a;

FIG. 6a is a cross-sectional view of the semiconductor topography, wherein the unreacted layers of titanium and cobalt are removed, in a processing step subsequent to FIG. 5a;

FIG. 7b is a cross-sectional view of the semiconductor topography, wherein the unreacted layers of titanium and cobalt are removed, in a processing step subsequent to FIG. 6b;

FIG. 8 is a cross-sectional view of the semiconductor topography, wherein the reacted layers of cobalt and titanium are annealed again to produce a lower resistance silicide, in a processing step subsequent to FIGS. 6a or 7b;

FIG. 9 is a cross-sectional view of the semiconductor topography, wherein an interlevel dielectric is deposited and reflowed upon the silicide, in a processing step subsequent to FIG. 8; and FIG. 10 is a detailed, atomic cut-away view along a portion of the silicide, showing effect of cobalt minimizing migration of titanium into the underlying source/drain junction during times when thermal energy is applied in, for example, the reflow cycle of FIG. 9.

Figure 1:
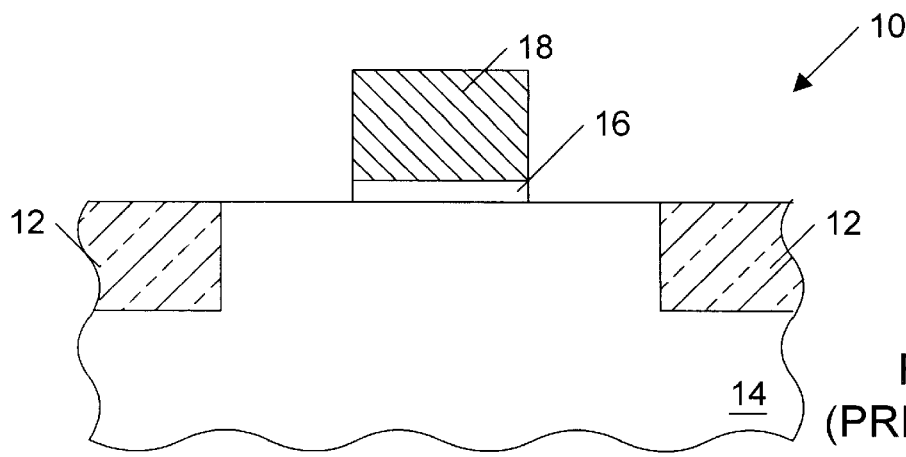
FIG. 1 is a cross-sectional view of a semiconductor topography having a gate conductor patterned a dielectric distance above the topography and spaced field regions formed within the topography.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a partial cross-sectional view of a semiconductor topography 10 having isolation regions 12 formed at select locations across the upper surface of a silicon-based substrate 14. Isolation regions 12 separate what is know as active areas from one another. The active areas accommodate active and passive devices formed upon and within each of the active areas. Isolation regions 12 can be formed using various methodology. For example, regions 12 result from a field dielectric disposed in shallow trenches which extend into substrate 14. These shallow trenches are formed by etching away portions of the silicon substrate upper surface. The resulting trench is then filled according to the well-known shallow trench isolation process.

After forming the active areas, a gate dielectric material followed by a gate conductive material is deposited and then patterned to form a gate dielectric 16 interposed between an active area and a gate conductor 18. The active area of substrate 14 between isolation regions 12 is preferably a single crystalline silicon receptive to a growing oxide on which a polycrystalline ("polysilicon") material is deposited. Patterning is achieved using well-known lithography techniques.

Figure 2:
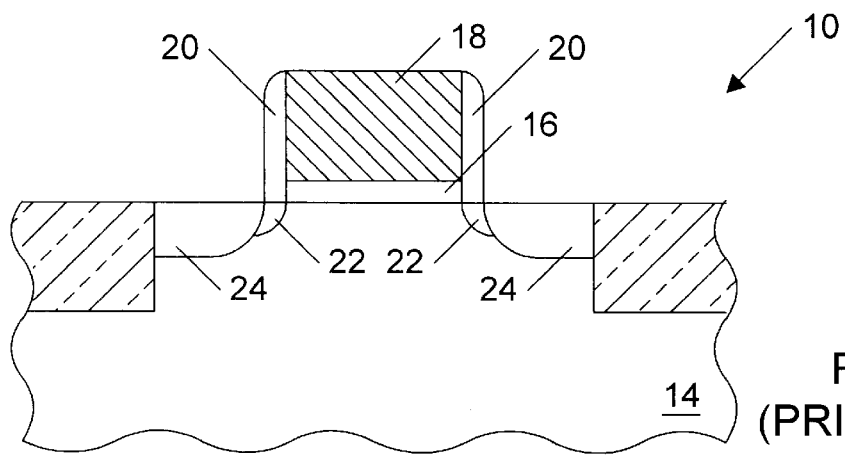
FIG. 2 is a cross-sectional view of the semiconductor topography, wherein sidewall spacers are formed on opposed lateral surfaces of the gate conductor to define source/drain implant regions spaced from a channel underlying the gate conductor, in a processing step subsequent to FIG. 1 (FIGS. 1 and 2 taken alone show conventional topographies)

Referring to FIG. 2, topography 10 is modified by depositing a dielectric across topography 10, and then anisotropically removing the dielectric to form sidewall spacers 20 on opposed sidewall surfaces of gate conductor 18 and gate dielectric 16. The dielectric material is preferably an oxide, such that sidewall spacer 20 are generally referred to as spacer oxides. Spacer 20 is formed after a lightly doped drain ("LDD") implant is self-aligned to the edges of gate conductor 18. LDD implant region is shown as reference numeral 22. After spacers 20 are formed, then a source/drain implant occurs, and is self-aligned to the lateral edges of spacers 20. The source/drain implant regions are shown as reference numeral 24.

Figure 3:
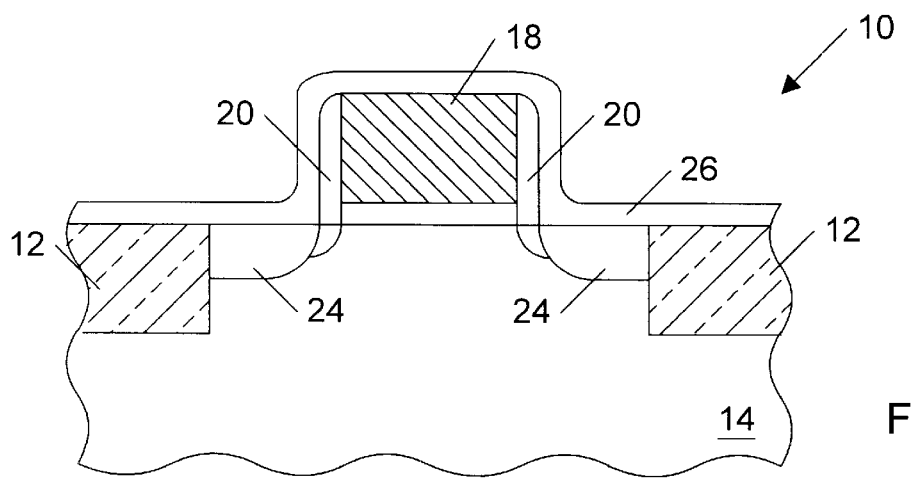
FIG. 3 is a cross-sectional view of the semiconductor topography, wherein a layer of titanium is blanket deposited upon the gate conductor, sidewall spacer and source/drain implant regions, in a processing step subsequent to FIG. 2.

Referring to FIG. 3, a layer of titanium 26 is blanket deposited across the topography 10. More specifically, titanium 26 is deposited across isolation regions 12, source/drain regions 24, sidewalls 20, and the upper surface of gate conductor 18. Titanium 26 can be deposited in numerous ways. For example, deposition can occur using a sputter technique, employing a relatively pure titanium sputter target occurring within a vacuum or an inert atmospheric chamber. Alternatively, titanium 26 is deposited using CVD at atmospheric pressure or low pressure. The CVD chamber can, according to one embodiment, comprise a nitrogen ambient. The thickness at which titanium 26 is deposited can vary depending on the target thickness of the ensuing silicide.

Figure 4A:
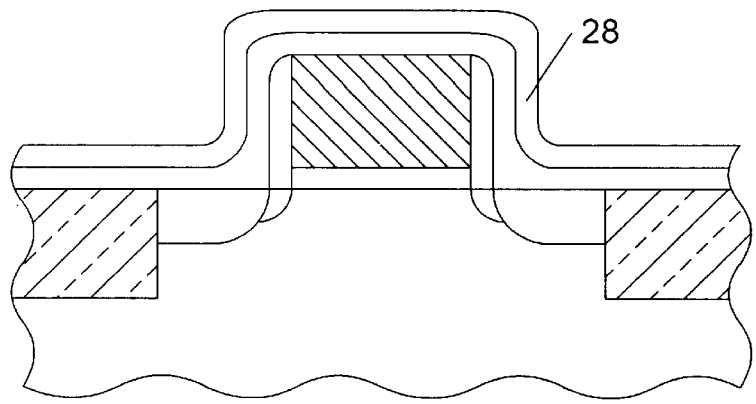
FIG. 4a is a cross-sectional view of the semiconductor topography, wherein a layer of cobalt is blanket deposited upon the layer of titanium, according to one embodiment, in a processing step subsequent to FIG. 3.

Turning now to FIGS. 4a–6a, a processing sequence is shown according to one embodiment. The processing sequence involves deposition of a layer of cobalt 28 upon the layer of titanium 26 prior to an anneal. FIG. 4a depicts cobalt 28 either sputter deposited or deposited from a CVD chamber to a thickness sufficient to maintain high conductivity within the cobalt layer of the ensuing device.

Figure 5A:
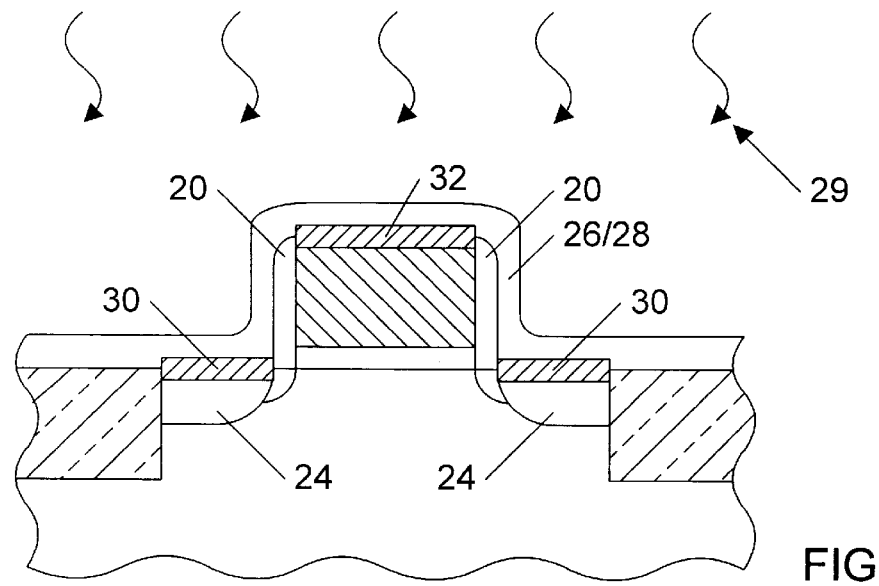

FIG. 5a illustrates annealing the layers of titanium and cobalt with the semiconductor topography. The anneal occurs through application of a heat cycle 29. Heat cycle 29 causes interdiffusion of the source/drain regions 24 with the layers of cobalt 28 and titanium 26. Interdiffusion of source/drain regions 24 with layers 26 and 28 causes a silicide 30 to form. Heat cycle 29 is preferably carried out in a diffusion furnace or a rapid thermal anneal ("RTA") chamber. If performed in an RTA chamber, then heat cycle 29 occurs between 600° C. to 750° C. for 30 to 60 seconds. The temperature and time ranges allow interdiffusion in silicon-rich underlayers. Due to barrier properties of cobalt (and/or nitrogen) silicide does not form on underlying oxide layers. In addition to silicide 30, interdiffusion also occurs at the upper surface of the gate conductor to form silicide 32 (or "polycide"). Silicides 30 and 32 occur concurrently, with little or no bridging between the silicides upon spacers 20.

Titanium, and to some extent, cobalt within layers 26 and 30 extend downward into the silicon-rich underlayers of areas 24 and 18. Likewise, silicon extends upward into layers 26 and 28. The amount of interdiffusion is controlled by the temperature and time involved in heat cycle 29. It is contemplated that the temperatures and time set forth above produce a preponderance of $XSi_Y$ where X is cobalt or titanium and Y is between 1 and 1.5. If the temperature of heat cycle 29 is increased to approximately to 800° C. to 900° C. then it is believed that a single anneal step can be used to produce titanium disilicide and cobalt disilicide in regions 30 and 32, where Y is approximately 2.0. More importantly, the silicides occur at elevated temperatures only within the silicon-rich regions and do not substantially bridge between those regions on oxide underlayers due in part to the cobalt barrier properties.

Figure 6A:
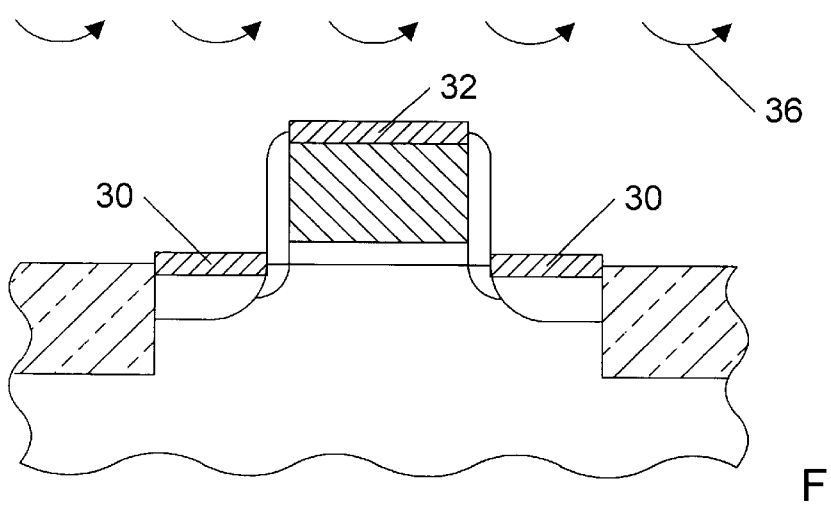

FIG. 6a depicts a subsequent processing step in which the unreacted (non-silicided) regions of layers 26 and 28 are removed as shown by arrows 36. Removing the unreacted titanium and cobalt can occur in a wet etchant solution. Titanium is removed using deionized water, $H_2O_2$ and $NH_4OH$. Cobalt is removed using deionized water with $HCl:H_2O_2$. What remains is silicides 30 and 32 only upon silicon-rich regions. An overetch may be needed if a single, high temperature anneal is performed. The amount of overetch desirably removes the interdiffusion of titanium into oxides, but does not substantially remove silicides 30 and 32. Preferably, cobalt serves as a barrier to reduce substantial amounts of metal-oxide interdiffusion. Further, cobalt prevents spiking of undue amounts of interdiffusion at the silicide-source/drain juncture. Alternatively, in addition to cobalt, nitrogen can be employed either during the deposition of titanium or during the anneal sequence, respectively shown in FIGS. 3 and 5a. Nitrogen serves as a barrier to titanium-oxide interdiffusion and/or titanium-silicide interdiffusion in critical regions, such as the spacer and/or shallow source/drain regions.

Figure 4B:
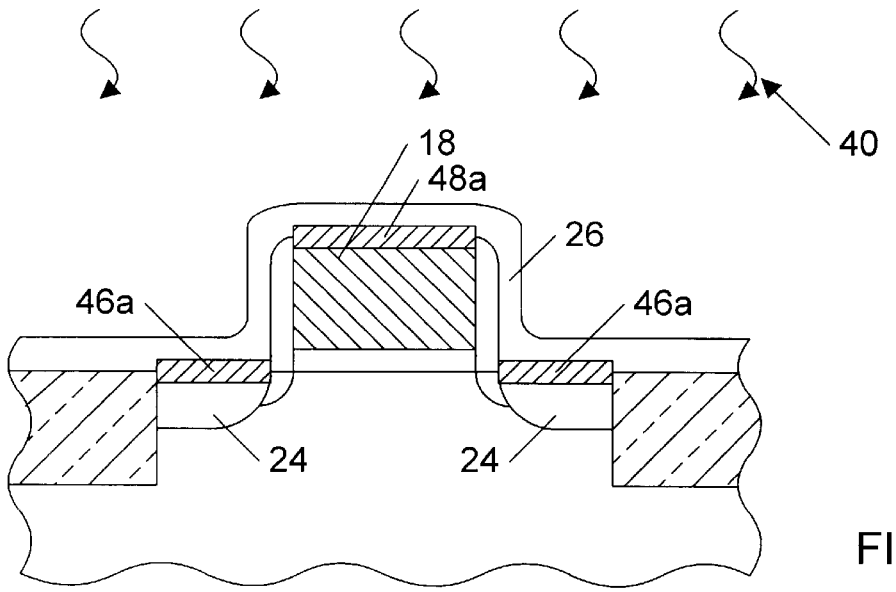
FIG. 4b is a cross-sectional view of the semiconductor topography, wherein the layer of titanium is annealed, according to an alternative embodiment, in a processing step subsequent to FIG. 3.

Referring to FIGS. 4b–7b, an alternative process sequence is shown to that of FIGS. 4a–6a. FIG. 4b illustrates a processing step subsequent to FIG. 3, wherein a heat cycle 40 is applied to titanium 26 prior to cobalt deposition. Heat cycle 40 can occur either in the presence of or in the absence of nitrogen, to cause an interdiffusion of titanium 26 with silicon surfaces 18 and 24. Preferably, anneal occurs in the presence of nitrogen to prevent undue interdiffusion into shallow junctions of source/drain areas 24. Anneal occurs preferably in an RTA chamber at 600° C. to 750° C. for 30 to 60 seconds. The desired temperature range and duration of heat cycle 40 minimizes interdiffusion within underlying oxides. Thus, heat cycle 40 comprises a first temperature cycle less than a second, and subsequent temperature cycle which occurs after the deposition of cobalt.

Figure 5B:
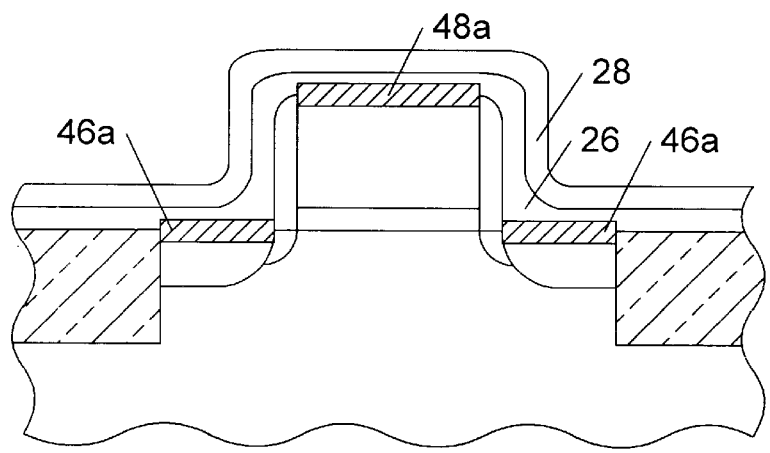
FIG. 5b is a cross-sectional view of the semiconductor topography, wherein a layer of cobalt is blanket deposited upon the annealed layer of titanium, in a processing step subsequent to FIG. 4b.

FIG. 5b illustrates depositing a layer of cobalt 28 upon the annealed layer of titanium 26. Cobalt 28 is blanket deposited without removing unreacted titanium 26, according to one embodiment. According to an alternative embodiment, unreacted portions of titanium 26 can be removed prior to depositing cobalt 28. Cobalt 28 is deposited, similar to titanium 26, from a sputter chamber or a CVD chamber.

Figure 6B:
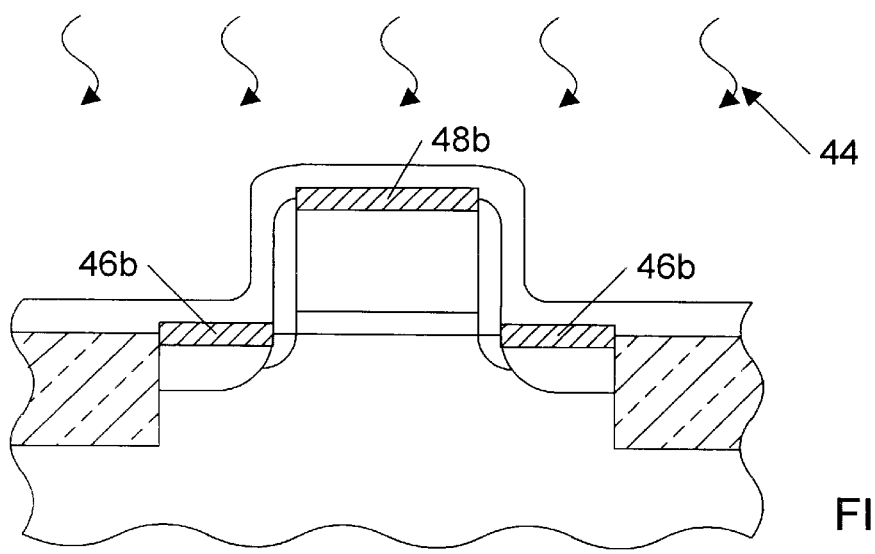
FIG. 6b is a cross-sectional view of the semiconductor topography, wherein the layer of cobalt is annealed to produce a self-aligned silicide upon only the gate conductor and the source/drain regions, in a processing step subsequent to FIG. 5b.

FIG. 6b illustrates a second anneal cycle 44 applied to the annealed titanium 26 and the layer of cobalt 28. Anneal cycle 44 occurs at a higher temperature than anneal cycle 40 (shown in FIG. 4b). Anneal cycle 44 preferably occurs at a temperature between 700° C. to 900° C. for 30 to 60 seconds, or any temperature and time duration needed to interdiffuse cobalt with titanium and underlying silicon, and vice versa. The result of heat cycle 44, is to produce titanium disilicide and cobalt disilicide in silicon-rich regions 46 and 48. Silicide regions 46b and 48b are bounded substantially the same as regions 46a and 48a, shown in FIGS. 4b and 5b.

Referring to FIG. 7b, the unreacted regions of titanium 26 and cobalt 28 are removed subsequent to the step shown in FIG. 6b. Removal is indicated by reference numeral 50. The removal etchant is preferably a wet etchant similar to that used and described in reference to FIG. 6a.

FIG. 8 depicts a processing step subsequent to FIG. 6a or 7b, according to one embodiment. If desired, a second anneal step can occur if the single anneal step shown in FIG. 5a or the dual anneal steps shown in FIGS. 4b and 6b are not sufficient. The second anneal step denoted as reference numeral 52 in FIG. 8 is designed to produce a lower resistance silicide 54 and 56 in the regions shown. Heat cycle 52 can be increased beyond the heat cycles denoted as reference numeral 29 in FIG. 5a or reference numeral 44 in FIG. 6b. Heat cycle 52 can therefore extend beyond 900° C. to achieve a lower resistance silicide phase. Heat cycle 52 is therefore an optional heat cycle usable only if the lowest possible resistance is desired within the contact areas. That resistance is achieved by converting more of the titanium and cobalt to stochiometric titanium disilicide and cobalt disilicide. However, it is understood that the optional, additional anneal cycle can be eliminated if previous single, or dual heat cycles produce a desired silicide phase. Accordingly, the present salicide can be formed using a dual layer metal within either a single, dual or tri-anneal sequence.

FIG. 9 illustrates an interlevel dielectric 58a deposited upon a topography comprising a single, dual or triple annealed silicide 60 and 62. Accordingly, silicides 60 and 62 encompass silicides 54 and 56, silicides 46b and 48b, or silicides 30 and 32. Interlevel dielectric 58a is preferably deposited as a planarizing layer, possibly using a CVD chamber or a spin-on technique. Dielectric 58a is of any composition that can possibly be reflowed to form a more planar interlevel dielectric 58b during exposure to heat 64. Interlevel dielectric 58 reforms during the reflow process to produce a more planar surface 66. Surface 66 therefore results from the reflow, which typically occurs at a relatively high temperature, e.g., in excess of 800° C. Thus, interlevel dielectric 58a is preferably a doped glass deposited over the salicided regions, and then reflowed to produce a more planar surface 66.

The reflow temperature needed to form surface 66 may cause significant problems in conventional salicides. However, as shown in FIG. 10, cobalt atoms 70 exist along possible migration avenues of titanium 72. More specifically, cobalt atoms 70 exist in migration avenues between titanium 72 and underlying silicon within silicon-rich source/drain areas 24. Thus, the cobalt serves to substantially minimize additional interdiffusing during the reflow.

Accordingly, FIG. 10 illustrates a detailed, atomic breakaway view along a portion of salicide 60. It is understood that the atomic composition of salicide 60 also applies to salicide 62, in relation to the silicon atoms within underlying junction 24 or gate conductor 18. An important benefit of depositing a layer of cobalt upon titanium is not only to enhance to the contact conductivity, but also to provide a slight barrier property to the interdiffusion of titanium with silicon. Cobalt silicide exhibits relatively low resistivity, in the range of 16–18 micro ohms-cm, relative to titanium silicide in the range of nearly 20 micro ohms-cm. Further, reaction of cobalt with silicon can occur in a single annealing step with no lateral formation of the silicide or encroachment under the intermediate oxide layers. Still further, cobalt disilicide occurs without requiring a competing reaction, with, for example, nitrogen. Thus, nitrogen need not be incorporated during the deposition or anneal of cobalt.

It will be appreciated to those skilled in the art having the benefit of this disclosure that this invention is believed to be capable of forming an integrated circuit having a plurality of relatively high conductive contacts. The highly conductive contacts are achieved partially as a result of using cobalt in addition to an underlying layer of titanium. It is to be understood that the form of the invention shown and described is to be taken as exemplary, presently preferred embodiments. Various modifications and changes may be made to each and every processing step without departing from the spirit and scope of the invention given the benefit of this disclosure as set forth in the claims. It is intended that the following claims be interpreted to embrace all such modifications and changes, and accordingly, specification and drawings are to be regarded in an illustrative rather than a restrictive sense.

What is claimed is:

1. A method for forming a silicide, comprising:

provide a source region and a drain region spaced from said source region by a gate conductor;

depositing a layer of titanium upon the source and drain regions and the gate conductor;

depositing a layer of cobalt upon the layer of titanium; and interdiffusing the source and drain regions with the layers of cobalt and titanium, wherein said interdiffusing occurs in the absence of nitrogen in the ambient.

2. The method as recited in claim 1, wherein said interdiffusing comprises heating the source and drain regions and the layers of cobalt and titanium.

3. The method as recited in claim 1, wherein said interdiffusing comprises:

heating the source and drain regions and the layers of cobalt and titanium at a first temperature;

removing portions of the layers of cobalt and titanium non-interdiffused with the source and drain regions; and heating the source and drain regions and the layers of cobalt and titanium at a second temperature greater than said first temperature.

4. The method as recited in claim 3, wherein said first temperature is sufficient to form $XSi_Y$, where X consists of titanium or cobalt and where Y is less than two.

5. The method as recited in claim 3, wherein said second temperature is sufficient to form $XSi_Y$, where X consists of titanium or cobalt and where Y is approximately two.

6. The method as recited in claim 1, wherein said interdiffusing further comprises concurrent interdiffusing the gate conductor with the layers of cobalt and titanium.

7. The method as recited in claim 1, further comprising:

depositing an interlevel dielectric upon the layers of cobalt and titanium interdiffused with the source and drain regions;

removing portions of the interlevel dielectric residing directly over the source and drain regions; and filling the removed portions of the interlevel dielectric with an interconnect metal.

8. The method as recited in claim 7, wherein said depositing further comprising reflowing the interlevel dielectric in the presence of thermal energy sufficient to minimize elevational disparities along an upper surface of the interlevel dielectric.

9. The method as recited in claim 8, wherein the cobalt substantially minimizes additional interdiffusing during said reflowing.

10. A method for forming a silicide, comprising:

providing a source region and a drain region spaced from each other by a gate conductor;

depositing a layer of titanium upon the source and drain regions and the gate conductor;

annealing the layer of titanium partially into the source and drain regions and into the gate conductor;

depositing a layer of cobalt upon the annealed said layer of titanium; and annealing the layer of cobalt partially into the source and drain regions and into the gate conductor.

11. The method as recited in claim 10, wherein annealing the layer of titanium comprises forming a reacted portion of the titanium partially into the source and drain regions and into the gate conductor.

12. The method as recited in claim 11, further comprising removing portions of the layer of titanium exclusive of the reacted portion subsequent to annealing the layer of titanium.

13. The method as recited in claim 11, further comprising removing portions of the layer of titanium exclusive of the reacted portion subsequent to annealing the layer of cobalt.

14. The method as recited in claim 10, wherein annealing the layer of cobalt comprises forming a reacted portion of the cobalt partially into the source and drain regions and into the gate conductor.

15. The method as recited in claim 14, further comprising removing portions of the layer of cobalt exclusive of the reacted portion subsequent to annealing the layer of cobalt.

16. The method as recited in claim 11, wherein said annealing the layer of titanium occurs in the absence of nitrogen in the ambient.

17. The method as recited in claim 11, further comprising:

removing unreacted portions of the layers of titanium and cobalt; and subsequent to said removing unreacted portions, annealing the remaining portions of the layers of titanium and cobalt.

18. The method as recited in claim 17, wherein said annealing the remaining portions occurs at a temperature greater than the temperature at which said annealing the layer of titanium and said annealing the layer of cobalt occur.

19. The method as recited in claim 11, wherein said annealing the layer of titanium and said annealing the layer of cobalt are sufficient to form $XSi_Y$, where X consists of titanium or cobalt and where Y is less than two.

20. A method for forming a silicide, comprising:

providing a source region and a drain region spaced from said source region by a gate conductor;

depositing a layer of titanium upon the source and drain regions and the gate conductor;

depositing a layer of cobalt upon the layer of titanium; and interdiffusing the source and drain regions with the layers of cobalt and titanium at a temperature sufficient to form $XSi_Y$, where X consists of titanium or cobalt and where Y is less than two.

* * * * *